United States Patent
Kim et al.

(10) Patent No.: US 10,135,017 B2
(45) Date of Patent: Nov. 20, 2018

(54) QUANTUM LIGHT EMITTING DIODE AND QUANTUM LIGHT EMITTING DEVICE INCLUDING THE SAME

(71) Applicant: LG Display Co., Ltd., Seoul (KR)

(72) Inventors: Byung-Geol Kim, Paju-si (KR); Wy-Yong Kim, Seoul (KR); Kyu-Nam Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/837,991

(22) Filed: Dec. 11, 2017

(65) Prior Publication Data
US 2018/0166643 A1 Jun. 14, 2018

(30) Foreign Application Priority Data

Dec. 13, 2016 (KR) .................. 10-2016-0169409

(51) Int. Cl.
| | |
|---|---|
| H01L 29/66 | (2006.01) |
| H01L 31/00 | (2006.01) |
| H01L 51/50 | (2006.01) |
| H01L 51/52 | (2006.01) |
| H01L 27/32 | (2006.01) |

(52) U.S. Cl.
CPC ........ H01L 51/502 (2013.01); H01L 51/5262 (2013.01); H01L 51/5275 (2013.01); *H01L 27/3225* (2013.01); *H01L 27/3262* (2013.01); *H01L 51/5056* (2013.01); *H01L 51/5072* (2013.01); *H01L 2251/5361* (2013.01)

(58) Field of Classification Search
USPC .............. 257/13, 40, 79–103, 918, 257/E51.018–E51.022, E33.001–E33.077, 257/E25.028; 438/22–47, 69, 493, 503, 438/507, 956
See application file for complete search history.

(56) References Cited

U.S. PATENT DOCUMENTS

| | | | |
|---|---|---|---|
| 2003/0057417 A1 | 3/2003 | Lee et al. | |
| 2009/0278141 A1* | 11/2009 | Coe-Sullivan | B82Y 20/00 257/89 |
| 2013/0240829 A1* | 9/2013 | Kuramachi | H01L 21/02458 257/9 |
| 2014/0291479 A1* | 10/2014 | Lu | H01L 31/035218 250/200 |
| 2016/0336526 A1 | 11/2016 | Hirosawa | |
| 2016/0363708 A1* | 12/2016 | You | G02B 6/005 |

FOREIGN PATENT DOCUMENTS

CN 107 293 647 A 10/2017

OTHER PUBLICATIONS

Xingliang Dai et al., Solution-processed, high-performance light-emitting diodes based on quantum dots, Nature, vol. 515, Nov. 6, 2014, Macmillan Publishers Limited.
Extended European Search Report dated May 14, 2018 issued in related application EP 17 20 6119.4.

* cited by examiner

*Primary Examiner* — Tram H Nguyen
(74) *Attorney, Agent, or Firm* — Polsinelli PC

(57) ABSTRACT

A quantum light emitting diode comprises a first electrode; a second electrode facing the first electrode; a light-amount enhancing layer between the first and second electrodes and having a structure guiding emitted light toward an emitting side; and an emitting material layer between the light-amount enhancing layer and the second electrode and including a quantum particle at the structure of the light-amount enhancing layer.

19 Claims, 4 Drawing Sheets

Viewer

Viewer

172

200

QUANTUM LIGHT EMITTING DIODE AND QUANTUM LIGHT EMITTING DEVICE INCLUDING THE SAME

CROSS-REFERENCE TO RELATED APPLICATION

This application claims priority to and the benefit of Republic of Korea Patent Application No. 10-2016-0169409 filed in the Republic of Korea on Dec. 13, 2016, which is hereby incorporated by reference in its entirety.

BACKGROUND

Field of the Disclosure

The present disclosure relates to a light emitting diode, and more particularly, to a quantum light emitting diode having improved brightness and a quantum light emitting device including the same.

Description of the Background

In an organic light emitting diode, when the current density or the driving voltage is increased to increase the brightness of the organic light emitting diode, the thermal degradation of the organic light emitting diode resulting from the decomposition of the organic emitting material may be generated such that the lifetime of the organic light emitting diode is reduced.

Recently, instead of the organic light emitting diode, a quantum light emitting diode including a quantum particle, such as a quantum dot (QD) or a quantum rod (QR), in an emitting layer has been researched. An emission peak of the quantum particle may be controlled by controlling a size of the quantum particle. In comparison to the organic emitting material, the quantum particle is stable in a thermal degradation and/or an oxidation reaction.

The quantum light emitting diode may include a charge layer for transporting a hole or an electron between an emitting layer and an electrode.

The quantum particle emits light from the side surface as well as the upper and lower surfaces. As a result, the light loss is generated, and the brightness of the quantum light emitting diode and the quantum light emitting device is decreased.

SUMMARY

Accordingly, the present disclosure is directed to a quantum light emitting diode and a quantum light emitting device (QLED) including the same that substantially obviate one or more of the problems due to limitations and disadvantages of the prior art, and have other advantages.

The present disclosure provides a quantum light emitting diode and a QLED having improved brightness.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

The present disclosure provides a quantum light emitting diode including a first electrode; a second electrode facing the first electrode; a light-amount enhancing layer between the first and second electrodes and having a structure guiding emitted light toward an emitting side; and an emitting material layer between the light-amount enhancing layer and the second electrode and including a quantum particle at the structure of the light-amount enhancing layer.

In addition, the present disclosure provides a quantum light emitting diode comprising a substrate; a quantum light emitting diode over the substrate and including a first electrode, a second electrode facing the first electrode, a light-amount enhancing layer between the first and second electrodes and having a structure guiding emitted light toward an emitting side and an emitting material layer between the light-amount enhancing layer and the second electrode and including a quantum particle at the structure of the light-amount enhancing layer; and a driving element between the substrate and the quantum light emitting diode and connected to the quantum light emitting diode.

Further, the present disclosure provides quantum light emitting diode, comprising an anode, a cathode facing the anode, a light-amount enhancing layer between the anode and the cathode and having a structure guiding emitted light toward an emitting side, an emitting material layer between the light-amount enhancing layer and the anode, and a quantum particle generating the emitted light and disposed at the light-amount enhancing layer.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Reference will now be made in detail to aspects of the disclosure, examples of which are illustrated in the accompanying drawings. Whenever possible, the same reference numbers will be used throughout the drawings to refer to the same or like parts.

Figure 1:
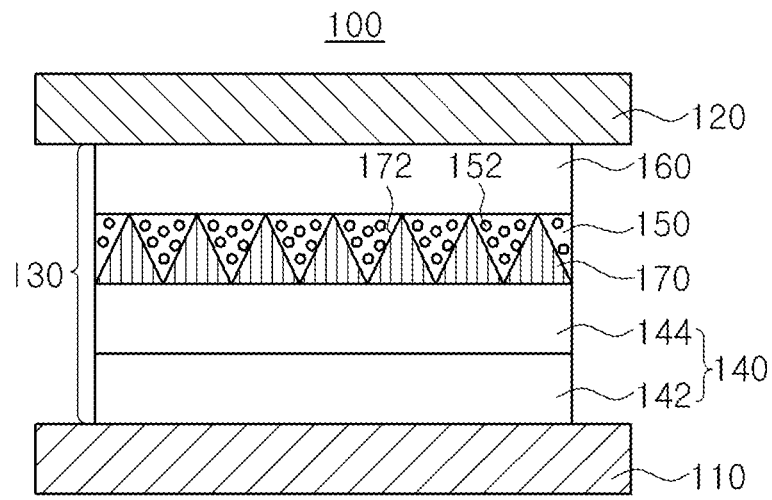
FIG. 1 is a schematic cross-sectional view of a quantum light emitting diode according to an aspect of the present disclosure.

FIG. 1 is a schematic cross-sectional view of a quantum light emitting diode according to an aspect of the present disclosure.

Referring to FIG. 1, the quantum light emitting diode 100 includes a first electrode 110, a second electrode 120 facing the first electrode 110 and an emitting layer 130, which includes an emitting material layer (EML) 150 and a light-amount enhancing layer 170, between the first and second electrodes 110 and 120. The light-amount enhancing layer 170 is disposed between the first electrode 110 and the EML 150.

The emitting layer 130 may further include a first charge transporting layer 140 between the first electrode 110 and the EML 150 and a second charge transporting layer 160 between the second electrode 120 and the EML 150. The light-amount enhancing layer 170 may be disposed between the first charge transporting layer 140 and the EML 150.

The first electrode 110 may be an anode as a hole injection electrode. The first electrode 110 may be formed on or over a substrate (not shown) of glass or polymer.

For example, the first electrode 110 may include or be formed of indium-tin-oxide (ITO), indium-zinc-oxide (IZO), indium-tin-zinc-oxide (ITZO), indium-copper-oxide (ICO), tin oxide ($SnO_2$), indium oxide ($In_2O_3$), cadmium-zinc oxide alloy (Cd:ZnO), fluorine-tin oxide alloy F:$SnO_2$, indium-tin oxide alloy (In:$SnO_2$), gallium-tin oxide alloy (Ga:$SnO_2$) or aluminum-zinc oxide alloy (Al:ZnO). Alternatively, the first electrode 110 may include or be formed of nickel (Ni), platinum (Pt), gold (au), silver (Ag), iridium (Ir) or carbon nano-tube (CNT).

The second electrode 120 may be a cathode as an electron injection electrode. For example, the second electrode 120 may include or be formed of Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

Each of the first and second electrodes 110 and 120 may have a thickness of about 50 to 300 nm. However, it is not limited thereto.

The first charge transporting layer 140 is disposed between the first electrode 110 and the EML 150. The first charge transporting layer 140 provides a hole into the EML 150. Namely, the first charge transporting layer 140 may be a hole transporting part. The quantum light emitting diode 100 having the above structure may be referred to as a normal structure.

For example, the first charge transporting layer 140 may include a hole injection layer (HIL) 142 and a hole transporting layer (HTL) 144 between the HIL 142 and the EML 150.

The hole injection property from the first electrode 110 into the EML 150 is secured by the HIL 142. For example, the HIL 142 may include at least one of poly(ethylene dioxythiophene):polystyrene sulfonate (PEDOT:PSS), 4,4', 4"-tris(diphenylamino)triphenylamine (TDATA) with tetra-fluoro-tetracyano-quinodimethane (F4-TCNQ) as a dopant material, zinc phthalocyanine (ZnPc) with a dopant of F4-TCNQ, N,N'-diphenyl-N,N'-bis(1-naphtyl)-1,1'-biphenyl-4,4"-diamine (α-NPD or α-NPB)with a dopant of F4-TCNQ, and hexaazatriphenylene-hexanitrile (HAT-CN), but it is not limited thereto. The dopant material such as F4-TCNQ may have a weight % of about 1 to 20 with respect to a host material.

The HTL 144 provides a hole from the first electrode 110 into the EML 150. The HTL 144 may include or be formed of an inorganic material or an organic material.

The organic material for the HTL 144 may be at least one of 4,4'-N,N'-dicarbazolyl-biphenyl (CBP), α-NPD (α-NPB), spiro-NPB, N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N,N'-diphenylbenzidine (DNTPD), 4,4', 4"-tris(N-carbazolyl)-triphenylamine (TCTA), tris(3-methylphenylphenylamino)-triphenylamine (m-MTDATA), poly(9,9'-dioctylfluorene-co-N-(4-butylphenyl)diphenylamine (TFB), poly(9-vinylcarbazole) (PVK), polyaniline, polypyrrole, copper phthalocyanine, 4,4'-bis(p-carbazolyl)-1,1'-biphenyl, N,N,N',N'-tetraarylbenzidine, PEDOT:PSS, poly-N-vinylcarbazole, poly[2-methoxy-5-(2-ethylhexyloxy)-1, 4-phenylenevinylene] (MEH-PPV), poly[2-methoxy-5-(3', 7'-dimethyloctyloxy)-1,4-phenylenevinylene] (MOMO-PPV), polymethacrylate, poly(9,9-octylfluorene), poly (spiro-fluorene), and their derivatives.

On the other hand, the inorganic material for the HTL 144 may be at least one of NiO, $MoO_3$, $Cr_2O_3$, $Bi_2O_3$, p-type ZnO, CuSCN, $Mo_2S$ and p-type GaN.

As shown in FIG. 1, the first charge transporting layer 140 has a double-layered structure of the HIL 142 and the HTL 144. Alternatively, the first charge transporting layer 140 may have a single-layered structure. For example, the first charge transporting layer 140 may include the HTL 144 without the HIL 142. In addition, a single-layered first charge transporting layer 140 may include an organic material for the HTL 144 and a hole injection material, e.g., PEDOT:PSS as a dopant material.

The first charge transporting layer 140 may be formed by a vacuum deposition process, e.g., vacuum vapor deposition or sputtering, or a solution process, e.g., spin coating, drop coating, dip coating, spray coating, roll coating, flow coating, casting, screen printing or inkjet printing.

For example, each of the HIL 142 and the HTL 144 may have a thickness of about 10 to 200 nm or about 10 to 100 nm. However, it is not limited thereto.

The EML 150 includes a quantum particle 152. The quantum particle 152 includes at least one of quantum dot (QD) or quantum rod (QR). For example, the QD may have an average diameter of about 1 to 100 nm, and the QR may have an average size of about 1 to 100 nm.

A solution including the quantum particle 152 in the solvent may be coated on the light-amount enhancing layer 170, and the solvent may be evaporated to form the EML 150. In this instance, a solution process, e.g., spin coating, drop coating, dip coating, spray coating, roll coating, flow coating, casting, screen printing or inkjet printing, may be used.

The quantum particle 152 in the EML 150 may be a semiconductor nano-crystal having a quantum confine effect. The quantum particle 152 may be a nano-semiconductor compound of II-VI group, I-III-VI group, IV-VI group or III-V group in the periodic table of the elements or a metal oxide nano-particle. For example, the quantum particle 152 may be Cd-free I-III-VI group compound or III-V group compound.

The quantum particle 152 may have a single-layered structure or a core-shell structure. In the core-shell structure, a core for emitting light is positioned in the center of the quantum particle 152, and a shell for protecting the core covers the core. A ligand for dispersing the quantum particle 152 into a solvent may be combined or cover a surface of the sell. The ligand may be removed when the EML 150 is formed.

For example, the quantum particle 152 may be II-VI group semiconductor nano-crystal, e.g., CdS, CdSe, CdTe, ZnS,ZnSe, ZnTe, HgS, HgTe or their combination, III-V group semiconductor nano-crystal, e.g., GaP, GaAs, GaSb, InP, InAs, InSb or their combination, IV-VI group semiconductor nano-crystal, e.g., PbS, PbSe, PbTe or their combination, metal oxide nano-particle, e.g., ZnO, $TiO_2$ or their combination, or the core-shell structure of CdSe/ZnSe, CdSe/ZnS, CdS/ZnSe, CdS/ZnS, ZnSe/ZnS, InP/ZnS or ZnO/MgO. In addition, a rare earth element, e.g., Eu, Er, Tb, Tm or Dy, or a transition metal element, e.g., Mn, Cu or Ag, may be doped.

The QD may be a homogeneous alloy or a gradient alloy. The gradient alloy may be $CdS_xSe_{1-x}$, $CdSe_xTe_{1-x}$ or $Zn_xCd_{1-x}Se$.

The quantum particle 152 may be synthesized by a wet-process. In the wet-process, a precursor is provided to an organic solvent, and the particle is grown by the reaction.

The EML 150 may include a quantum particle 152 having a PL peak of 440 nm, a quantum particle 152 having a PL peak of 530 nm and a quantum particle 152 having a PL peak of 620 nm such that the white light may be provided. Alternatively, the quantum particle 152 in the EML 150 may emits the red light, the green light or the blue light. The nano-crystal for the quantum particle 152 may be one of CdS, CdSe, CdTe, ZnS,ZnSe, ZnTe, HgS, HgTe or their combination.

The second charge transporting layer 160 is positioned between the EML 150 and the second electrode 120. The second charge transporting layer 160 may be an electron transporting layer (ETL) such that the electron from the second electrode 120 is provided to the EML 150 by the second charge transporting layer 160.

The second charge transporting layer 160 may include or be formed of an inorganic material or an organic material.

The inorganic material for the second charge transporting layer 160 may be at least one of doped or non-doped metal oxide or non-metal oxide, e.g., $TiO_2$, ZnO, ZrO, $SnO_2$, $WO_3$, $Ta_2O_3$, $HfO_3$, $Al_2O_3$, $ZrSiO_4$, $BaTiO_3$ or $BaZrO_3$, doped or non-doped semiconductor particle, e.g., CdS, ZnSe or ZnS, and nitride, e.g., $Si_3N_4$. A dopant for the metal oxide, non-metal oxide and the semiconductor particle may be one of Al, Mg, In, Li, Ga, Cd, Cs or Cu.

The organic material for the second charge transporting layer 160 may be oxazole compound, iso-oxazole compound, triazole compound, is-triazole compound, oxydiazole compound, thiadiazole compound, perylene compound or aluminum complex. For example, the organic material may include at least one of 2,9-dimethyl-4,7-diphenyl-1,10-phenanthroline (BCP), 2,2',2"-(1,3,5-Benzinetriyl)-tris(1-phenyl-1-H-benzimidazole) (TPBi), tris(8-hydroxyquinoline)aluminum ($Alq_3$), bis(2-methyl-8-quninolinato)-4-phenylphenolate aluminum (III) (Balq), bis(2-methylquinolinato)(tripnehylsiloxy) aluminum (III) (Salq), or their combination, but it is not limited thereto.

The ZnO particle has an excellent electron mobility and a good match with a conduction energy of the quantum particle 152, so that ZnO is used for the second charge transporting layer 160.

In order to improve an emitting property of the quantum light emitting diode 100, the HTL 142 is formed of an organic material and the second charge transporting layer 160 is formed of an inorganic material. Alternatively, the HTL142 can be formed of an inorganic material when the second charge transporting layer 160 is formed of an organic material. (a hybrid structure)

The second charge transporting layer 160 may have a double-layered structure. For example, the second charge transporting layer 160 may include an ETL between the EML 150 and the second electrode 120 and an electron injection layer (EIL) between the ETL and the second electrode 120.

The electron injection property from the second electrode 120 into the EML 150 is secured by the EIL. For example, the EIL may include doped or non-doped metal, e.g., Al, Cd, Cs, Cu, Ga, Ge, In or Li, or doped or non-doped metal oxide, e.g., ZnO, ZrO, $SnO_2$, $WO_3$, or $Ta_2O_3$. A dopant for the metal may be fluorine, and the dopant for the metal oxide may be Al, Mg, In, Li, Ga, Cd, Cs or Cu.

The second charge transporting layer 160 may be formed by a vacuum deposition process, e.g., vacuum vapor deposition or sputtering, or a solution process, e.g., spin coating, drop coating, dip coating, spray coating, roll coating, flow coating, casting, screen printing or inkjet printing. For example, each of the EIL and the ETL may have a thickness of about 10 to 200 nm, and alternatively about 10 to 100 nm. However, it is not limited thereto.

Figure 2A:
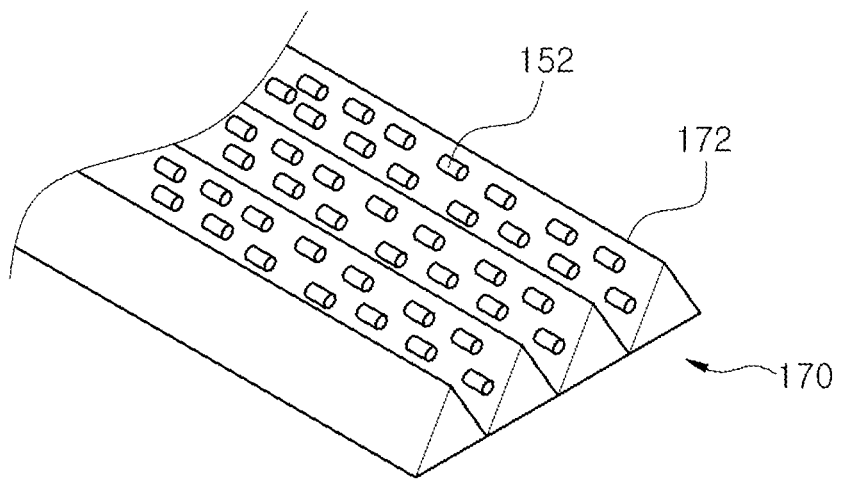
FIGS. 2A and 2B are schematic views showing arrangement of quantum particles and a light-amount enhancing layer, respectively.
Figure 2B:
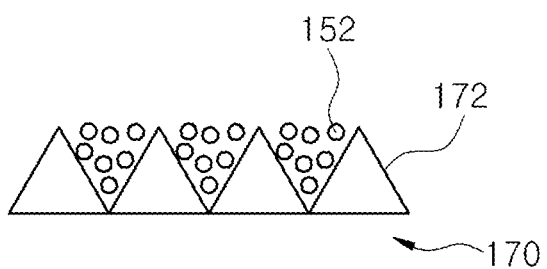

The light-amount enhancing layer 170 includes a pattern to provide a concave portion and a convex portion. For example, the light-amount enhancing layer 170 may include a plurality of prim pattern 172 as shown in FIGS. 2A and 2B. The prism patterns 172 protrude from the first charge transporting part 140 toward the second charge transporting part 160, and the quantum particles 152 are disposed or arranged between adjacent prims patterns 172. Namely, the quantum particles 152 are disposed in the concave portion of the light-amount enhancing layer 170. The adjacent prism patterns 172 may be spaced apart from each other to expose a portion of the first charge transporting layer 140 so that the light emitted from the quantum particle 152 can be efficiently provided toward an emitting side (or a display side) of the quantum light emitting diode 100. However, when the prism patterns 172 are continuously formed without exposing a portion of the first charge transporting layer 140, the hole injection or hole transporting property from the first charge transporting layer 140 into the EML 150 may be degraded.

When the quantum particle 152 is the QR, the quantum particle 152 is arranged such that a major axis of the QR may be parallel to a direction of the prism pattern 172, i.e., a length direction of the prism pattern 172.

FIGS. 2A and 2B are a schematic view showing arrangement of a quantum particle and a light-amount enhancing layer, respectively.

Referring to FIG. 2A, the light-amount enhancing layer 170 is patterned to have a prism shape, and the quantum particles 152 are arranged between adjacent prism patterns 172.

For example, a solution including a precursor for the light-amount enhancing layer 170 may be coated on the first charge transporting layer 140 (shown in FIG. 1), and a photolithograph process may be performed to provide the light-amount enhancing layer 170 including the prism patterns 172 on the first charge transporting layer 140. For example, the light-amount enhancing layer 170 may have a thickness of about 1 to 200 nm.

The light-amount enhancing layer 170 may include an insulating material, e.g., polymethylmetacrylate (PMMA), polyethylenenaphthalate (PEN) or polyethyleneterephthalate (PET). A photo-sensitive resin composition including monomer (and/or oligomer), solvent, photo-polymerization initiator, cross-linking agent, photo-sensitive compound and photo-acid generator may be coated on the first charge transporting layer 140 by one of spin coating, drop coating, dip coating, spray coating, roll coating, flow coating, casting, screen printing or inkjet printing.

The organic solvent for the photo-sensitive resin composition may be alcohol, ethyleneglycolalkyletherpropionate, ethyleneglycolmonoalkylether, diethyleneglycolalkylether, propyleneglycolalkyletheracetate, propyleneglycolalkyletherpropionate, propyleneglycolmonoalkylether, dipropyleneglycolalkylether, butyleneglycolmonoalkylether, dibutyleneglycolalkylether or γ-butyrolctone.

The photo-polymerization initiator may be acetophenon-based photo-polymerization initiator, benzophenon-based photo-polymerization initiator, thioxane-based photo-polymerization initiator, benzoin-based photo-polymerization initiator or triazine-based photo-polymerization initiator.

The photo-sensitive compound may be 1,2-quninondiazide compound. A material obtained by reacting phenol compound and naphtoquinondiazide sulfonic acid halogen compound may be used. For example, photo-sensitive compound may be 1,2-quninondiazide-4-sulfonic acid ester, 1,2-quninondiazide-5-sulfonic acid ester or 1,2-quninondiazide-6-sulfonic acid ester.

A cross-linking agent may be melamine cross-linking agent. The melamine cross-linking agent may be a condensation product of urea and formaldehyde, a condensation product of melamine and formaldehyde, methylureaalkylester, which is obtained from alcohol, or methylolmelaminealkylester. The condensation product of urea and formaldehyde may be monomethylolurea or dimethylolurea. The condensation product of melamine and formaldehyde may be hexamethylolmelamine.

When a negative-type photolithography process is desired, the photo-acid generator may be ionic photo-acid generator, e.g., sulphonium salt or iodine salt, sulfonyldiazomethane-based photo-acid generator, N-sulfonyloxyimide-based photo-acid generator, benzoinsulfonate-based photo-acid generator, nitrobenzylsulfonate-based photo-acid generator, sulfone-based photo-acid generator, glyoxime-based photo-acid generator or triazine-based photo-acid generator.

The photolithography process may include a pre-baking step, an exposing step, a developing step and a post-baking step. For example, the pre-baking step may be performed under a temperature of 80 to 120° C. for 1 to 15 minutes. The light source of visible ray, UV ray or X-ray may be used in the exposing step. The UV ray having a wavelength range of about 200 to 400 nm, alternatively 300 to 400 nm, may be used in the exposing step.

In the developing step, a developer, e.g., alkali aqueous solution or amine-based solution, may be used. After the developing process and before the post-baking process, a cleaning process using ultrapure water may be performed. The post-baking process may be performed in an oven or a hot-plate under a temperature of 130 to 150° C. for 30 to 90 minutes or under a temperature of 200 to 250° C. for 10 to 30 minutes.

A quantum particle material may be coated on the light-amount enhancing layer 170, and the solvent may be removed to form the EML 150 including the quantum particles 152 in adjacent prism patterns 172.

Figure 3A:
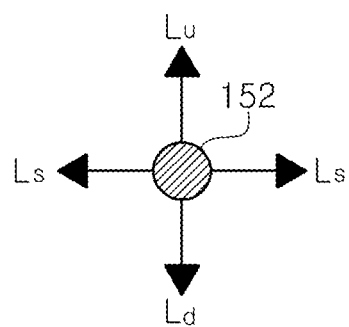
FIG. 3A is a schematic view showing a light loss in the quantum particles of the related art light emitting diode and FIG. 3B is a schematic view explaining the brightness improvement by the light-amount enhancing layer in the present disclosure.
Figure 3B:
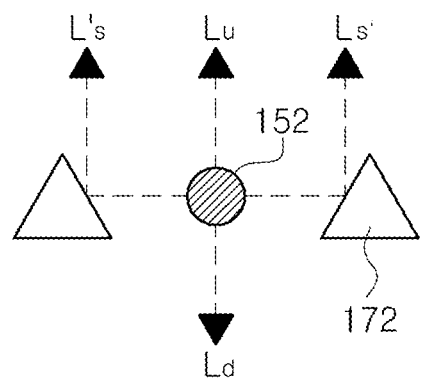

FIG. 3A is a schematic view showing a light loss in the quantum particles of the related art light emitting diode and FIG. 3B is a schematic view explaining the brightness improvement by the light-amount enhancing layer in the present disclosure.

The viewer side is a display side (an emitting side) of the quantum light emitting diode.

Referring to FIGS. 3A and 3B, the light from the quantum particle 152 is classified into a first light Lu emitted toward the emitting side, a second light Ld emitted toward a bottom side opposite to the emitting side and a third light Ls emitted toward a lateral side.

As shown in FIG. 3A, when the first to third lights Lu, Ld and Ls have the same amount, only the first light Lu participates in displaying an image without the light-amount enhancing layer 170. Namely, the second and third lights Ld and Ls from the quantum particle 152 do not contribute to the brightness of the quantum light emitting diode 100. Accordingly, since there is a great amount of light loss, the out-coupling efficiency and the brightness of the quantum light emitting diode 100 are decreased.

However, referring to FIG. 3B, with the light-amount enhancing layer 170 including the prism pattern 170, the direction of the third light L's is changed by the prism pattern 172 toward the emitting side. Namely, when the quantum particle 152 is arranged between adjacent prism patterns 172, not only the first light Lu but also the third light L's contribute to display an image. Accordingly, the light loss is minimized, and the out-coupling efficiency and the brightness of the quantum light emitting diode 100 can be increased.

On the other hand, by modifying the shape of the prism pattern 172, the light amount toward the emitting side may be improved or controlled.

Figure 4:
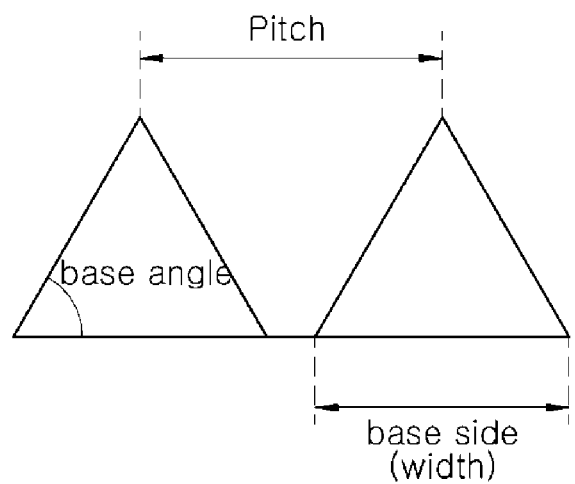
FIG. 4 is a schematic view explaining a relation of a base side, a base angle and a pitch of a prism pattern in the light-amount enhancing layer.

Referring to FIG. 4, which is a schematic view explaining a relation of a base side, a base angle and a pitch of a prism pattern in the light-amount enhancing layer, the prism pattern 172 having a cross-section of a triangle shape may have a base angle of about 10 to 45 degree, alternatively about 10 to 24 degree, or about 16 to 24 degree. In addition, a ratio of a height to a base side (width) of the prism pattern 172 may be 1:2 to 1:10, 1:4.5 to 1:10, or 1:4.5 to 1:7. Moreover, a ratio of the width to a pitch (i.e., a distance between centers of adjacent prism patterns) of the prism pattern 172 may be 1:1 to 2:3, or 4:5 to 2:3. But, it is not limited thereto. When the ratio of the width to the pitch is greater than 2:3, the distance between adjacent prism patterns 172 is too far such that the brightness increase by the third light L's (shown in FIG. 3) is decreased. On the other hand, when the pitch is equal to or smaller than the length of the base side, e.g., continuous prism patterns 172, the hole from the first charge transporting part 140 into the EML 150 may be blocked by the prism pattern 172. Accordingly, in the prism pattern 172, the pitch may be larger than the length of the base side.

In the present disclosure, the quantum light emitting diode 100 includes the light-amount enhancing layer 170, where the quantum particles 152 are arranged in the concave portion, e.g., a space between adjacent prism patterns 172, between the first charge transporting layer 140 and the EML 150 such that the direction of the light emitted from the quantum particle 152 toward the lateral side is changed toward the emitting side. Accordingly, the light loss is decreased, and the light amount toward the emitting side is increased. As a result, the out-coupling efficiency and the brightness of the quantum light emitting diode 100 can be improved.

FIGS. 1 to 4 show the light-amount enhancing layer 170 having a prism pattern 172 with a triangular shape in the cross-section. However, there is no limitation in the shape of the pattern in the light-amount enhancing layer 170 with a space for the quantum particle 152 between adjacent patterns. Namely, the light-amount enhancing layer 170 includes a plurality of patterns, and each pattern has a thickness being greater than a thickness of the quantum particle 152 and an inclined side surface.

Figure 5:
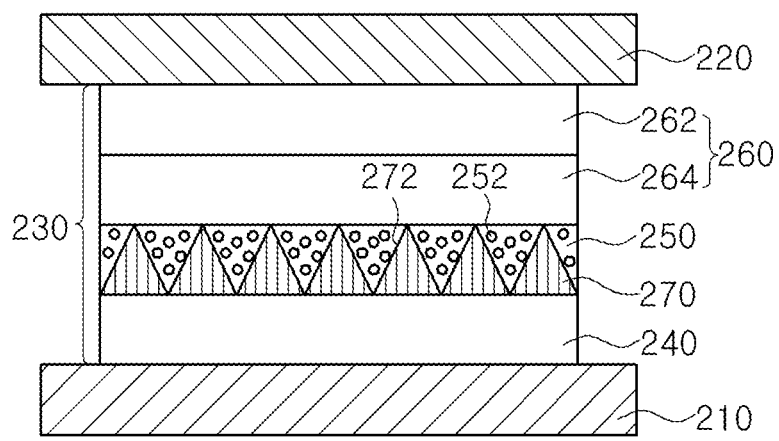
FIG. 5 is a schematic cross-sectional view of a quantum light emitting diode according to another aspect of the present disclosure.

FIG. 5 is a schematic cross-sectional view of a quantum light emitting diode according to another aspect of the present disclosure.

Referring to FIG. 5, the quantum light emitting diode 200 includes a first electrode 210, a second electrode 220 facing the first electrode 210 and an emitting layer 230, which includes an emitting material layer (EML) 250 and a light-amount enhancing layer 270, between the first and second electrodes 210 and 220. The light-amount enhancing layer 270 is disposed between the first electrode 210 and the EML 250.

The emitting layer 230 may further include a first charge transporting layer 240 between the first electrode 210 and the EML 250 and a second charge transporting layer 260 between the second electrode 220 and the EML 250. The light-amount enhancing layer 270 may be disposed between the first charge transporting layer 240 and the EML 250.

The first electrode 210 may be an anode as an electron injection electrode. For example, the first electrode 210 may include or be formed of indium-tin-oxide (ITO), indium-zinc-oxide (IZO), indium-tin-zinc-oxide (ITZO), indium-copper-oxide (ICO), tin oxide ($SnO_2$), indium oxide ($In_2O_3$), cadmium-zinc oxide alloy (Cd:ZnO), fluorine-tin oxide alloy F:$SnO_2$), indium-tin oxide alloy (In:$SnO_2$), gallium-tin oxide alloy (Ga:$SnO_2$) or aluminum-zinc oxide alloy (Al:ZnO). Alternatively, the first electrode 210 may include or be formed of nickel (Ni), platinum (Pt), gold (au), silver (Ag), iridium (Ir) or carbon nano-tube (CNT).

The second electrode 220 may be a cathode as a hole injection electrode. For example, the second electrode 220 may include or be formed of Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

Each of the first and second electrodes 210 and 220 may have a thickness of about 50 to 300 nm. However, it is not limited thereto.

The electron from the first electrode 210 is provided into the EML 250 by the first charge transporting layer 240. For example, the first charge transporting layer 240 may be an ETL.

The first charge transporting layer 240 as the ETL may include or be formed of an inorganic material or an organic material.

An inorganic material for the first charge transporting layer 240 may be formed of at least one of doped or non-doped metal oxide or non-metal oxide, e.g., $TiO_2$, ZnO, ZrO, $SnO_2$, $WO_3$, $Ta_2O_3$, $HfO_3$, $Al_2O_3$, $ZrSiO_4$, $BaTiO_3$ or $BaZrO_3$, doped or non-doped semiconductor particle, e.g., CdS, ZnSe or ZnS, and nitride, e.g., $Si_3N_4$. The dopant for the metal oxide, non-metal oxide and the semiconductor particle may be formed of at least one of Al, Mg, In, Li, Ga, Cd, Cs or Cu.

An organic material for the first charge transporting layer 240 may be formed of one of oxazole compound, isoxazole compound, triazole compound, is-triazole compound, oxydiazole compound, thiadiazole compound, perylene compound or aluminum complex. For example, the organic material may be formed of at least on of 2,9-dimethyl-4,7-diphenyl-1,10-phenanthroline (BCP), 2,2',2"-(1,3,5-Benzinetriyl)-tris(1-phenyl-1-H-benzimidazole) (TPBi), tris(8-hydroxyquinoline)aluminum ($Alq_3$), bis(2-methyl-8-quninolinato)-4-phenylphenolate aluminum (III) (Balq), bis(2-methyl-quinolinato)(tripnehylsiloxy) aluminum (III) (Salq), or their combination, but it is not limited thereto.

The first charge transporting layer 240 may have a double-layered structure. For example, the first charge transporting layer 240 may include an ETL between the EML 250 and the first electrode 210 and an EIL between the ETL and the first electrode 210.

For example, the EIL may include doped or non-doped metal, e.g., Al, Cd, Cs, Cu, Ga, Ge, In or Li, or doped or non-doped metal oxide, e.g., ZnO, ZrO, $SnO_2$, $WO_3$, or $Ta_2O_3$. A dopant for the metal may be fluorine, and the dopant for the metal oxide may be Al, Mg, In, Li, Ga, Cd, Cs or Cu.

The EML 250 includes a quantum particle 252. The quantum particle 252 includes at least one of QD or QR. A solution including the quantum particle 252 in the solvent may be coated on the light-amount enhancing layer 270, and the solvent may be evaporated to form the EML 250.

The quantum particle 252 in the EML 250 may be a semiconductor nano-crystal having a quantum confine effect. The quantum particle 252 may be a nano-semiconductor compound of II-VI group, I-III-VI group, IV-VI group or III-V group in the periodic table of the elements or a metal oxide nano-particle. For example, the quantum particle 252 may be Cd-free I-III-VI group compound or III-V group compound. The quantum particle 252 may have a single-layered structure or a core-shell structure.

For example, the quantum particle 252 may be II-VI group semiconductor nano-crystal, e.g., CdS, CdSe, CdTe, ZnS, ZnSe, ZnTe, HgS, HgTe or their combination, III-V group semiconductor nano-crystal, e.g., GaP, GaAs, GaSb, InP, InAs, InSb or their combination, IV-VI group semiconductor nano-crystal, e.g., PbS, PbSe, PbTe or their combination, metal oxide nano-particle, e.g., ZnO, $TiO_2$ or their combination, or the core-shell structure of CdSe/ZnSe, CdSe/ZnS, CdS/ZnSe, CdS/ZnS, ZnSe/ZnS, InP/ZnS or ZnO/MgO. A rare earth element, e.g., Eu, Er, Tb, Tm or Dy, or a transition metal element, e.g., Mn, Cu or Ag, may be doped.

The QD may be a homogeneous alloy or a gradient alloy. The gradient alloy may be $CdS_xSe_{1-x}$, $CdSe_xTe_{1-x}$ or $Zn_xCd_{1-x}$ Se.

The EML 250 may include a quantum particle 252 having a PL peak of 440 nm, a quantum particle 252 having a PL peak of 530 nm and a quantum particle 252 having a PL peak of 620 nm such that the white light may be provided. Alternatively, the quantum particle 252 in the EML 250 may emit the red light, the green light or the blue light.

The second charge transporting layer 260 is disposed between the second electrode 220 and the EML 250. The second charge transporting layer 260 provides a hole into the EML 250. Namely, the second charge transporting layer 260 may be a hole transporting part. The quantum light emitting diode 200 having the above structure may be referred to as an inversion (inverted) structure.

For example, the second charge transporting layer 260 may include an HIL 262 between the second electrode 220 and the EML 250 and an HTL 264 between the HIL 262 and the EML 250.

For example, the HIL 262 may include at least one of poly(ethylene dioxythiophene):polystyrene sulfonate (PEDOT:PSS), 4,4',4"-tris(diphenylamino)triphenylamine (TDATA) with tetrafluoro-tetracyano-quinodimethane (F4-TCNQ) as a dopant material, zinc phthalocyanine (ZnPc) with a dopant of F4-TCNQ, N,N'-diphenyl-N,N'-bis(1-naphtyl)-1,1'-biphenyl-4,4"-diamine (α-NPD or α-NPB)with a dopant of F4-TCNQ, and hexaazatriphenylene-hexanitrile (HAT-CN), but it is not limited thereto. The dopant material such as F4-TCNQ may have a weight % of about 1 to 20 with respect to a host material.

The HTL 264 may include or be formed of an inorganic material or an organic material.

The organic material for the HTL 264 may be at least one of 4,4'-N,N'-dicarbazolyl-biphenyl (CBP), α-NPD (α-NPB), spiro-NPB, N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N,N'-diphenylbenzidine (DNTPD), 4,4', 4"-tris(N-carbazolyl)-triphenylamine (TCTA), tris(3-methylphenylphenylamino)-triphenylamine (m-MTDATA), poly(9,9'-dioctylfluorene-co-N-(4-butylphenyl)diphenylamine (TFB), poly(9-vinylcarbazole) (PVK), polyaniline, polypyrrole, copper phthalocyanine, 4,4'-bis(p-carbazolyl)-1,1'-biphenyl, N,N,N',N'-tetraarylbenzidine, PEDOT:PSS, poly-N-vinylcarbazole, poly[2-methoxy-5-(2-ethylhexyloxy)-1,4-phenylenevinylene] (MEH-PPV), poly[2-methoxy-5-(3',7-dimethyloctyloxy)-1,4-phenylenevinylene] (MOMO-PPV), polymethacrylate, poly(9,9-octylfluorene), poly (spiro-fluorene), and their derivatives.

On the other hand, the inorganic material for the HTL 264 may be at least one of NiO, $MoO_3$, $Cr_2O_3$, $Bi_2O_3$, p-type ZnO, CuSCN, $Mo_2S$ and p-type GaN.

As shown in FIG. 5, the second charge transporting layer 260 has a double-layered structure of the HIL 262 and the HTL 264. Alternatively, the second charge transporting layer 260 may have a single-layered structure. For example, the second charge transporting layer 260 may include the HTL 264 without the HIL 262. In addition, a single-layered second charge transporting layer 260 may include an organic material for the HTL 264 and a hole injection material, e.g., PEDOT:PSS as a dopant material.

The light-amount enhancing layer 270 is positioned between the first charge transporting layer 240 and the EML 250. The light-amount enhancing layer 270 includes a concave portion and a convex portion. For example, the light-amount enhancing layer 270 may include a plurality of prim patterns 272. The prism patterns 272 protrude from the first charge transporting part 240 toward the second charge transporting part 260, and the quantum particles 252 are disposed or arranged between adjacent prims patterns 272. Namely, the quantum particles 252 are disposed in the concave portion of the light-amount enhancing layer 270. The light emitted from the quantum particle 252 efficiently provided toward an emitting side of the quantum light emitting diode 200.

The light-amount enhancing layer 270 may include an insulating material, e.g., polymethylmetacrylate (PMMA), polyethylenenaphthalate (PEN) or polyethyleneterephthalate (PET). The light-amount enhancing layer 270 of the insulating material is positioned between the first charge transporting layer 240 as the electron transporting part and the EML 250 such that the amount of the electron from the first charge transporting layer 240 into the EML 250 may be controlled. In the quantum light emitting diode 200, the hole injection barrier energy is greater than the electron injection barrier energy. In the quantum light emitting diode 200 of the present disclosure, since the light-amount enhancing layer 270 of the insulating material is positioned between the first charge transporting layer 240 as the electron transporting part and the EML 250, the balance of the holes and the electrons in the EML 250 can be improved or optimized.

The quantum particle 252 is disposed in a space between adjacent prism patterns 272, i.e., a concave portion of the light-amount enhancing layer 270, such that the direction of the light from the quantum particle 252 toward the lateral side is changed toward the emitting side. Accordingly, the light loss is reduced, and the out-coupling efficiency and the brightness of the quantum light emitting diode 200 are increased.

The quantum light emitting diode of the present disclosure may be used for a display device or an illumination (lightening) device.

Figure 6:
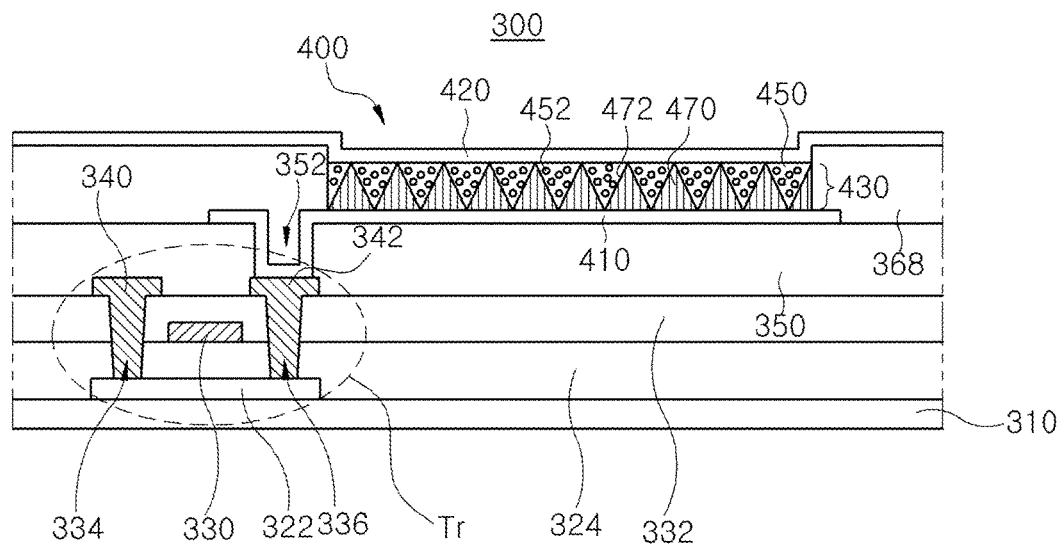
FIG. 6 is a schematic cross-sectional view of a QLED according to the present disclosure.

FIG. 6 is a schematic cross-sectional view of a quantum light emitting diode (QLED) according to the present disclosure.

Referring to FIG. 6, the QLED 300 includes a thin film transistor (TFT) Tr, a quantum light emitting diode 400 over the TFT Tr and connected to the TFT Tr. The TFT Tr serves as a driving element.

The TFT Tr is disposed on or over a substrate 310 and includes a semiconductor layer 322, a gate electrode 330, a source electrode 340 and a drain electrode 342.

The substrate 310 may be a glass substrate or a flexible substrate. The flexible substrate may be a polymer, e.g., polyimide, substrate. The substrate 310, on which the TFT Tr and the quantum light emitting diode 400 are formed, may be referred to as an array substrate.

The semiconductor layer 322 is formed on the substrate 310. The semiconductor layer 322 may be formed of an oxide semiconductor material or a poly-silicon.

When the semiconductor layer 322 includes the oxide semiconductor material, a light-shielding pattern (not shown) may be formed under the semiconductor layer 322. The light to the semiconductor layer 322 is shielded or blocked by the light-shielding pattern such that a thermal degradation of the semiconductor layer 322 can be prevented. On the other hand, when the semiconductor layer 322 includes polycrystalline silicon, impurities may be doped into both sides of the semiconductor layer 322.

A gate insulating layer 324 is formed on the semiconductor layer 322. The gate insulating layer 324 may be formed of an inorganic insulating material such as silicon oxide or silicon nitride.

A gate electrode 330, which is formed of a conductive material, e.g., metal, is formed on the gate insulating layer 324 to correspond to a center portion of the semiconductor layer 322.

In FIG. 6, the gate insulating layer 324 is formed on the entire surface of the substrate 310. Alternatively, the gate insulating layer 324 may be patterned to have the same shape as the gate electrode 330.

An interlayer insulating layer 332, which is formed of an insulating material, is formed on the entire surface of the substrate 310 including the gate electrode 330. The interlayer insulating layer 332 may be formed of an inorganic insulating material, e.g., silicon oxide or silicon nitride, or an organic insulating material, e.g., benzocyclobutene or photo-acryl.

The interlayer insulating layer 332 includes first and second contact holes 334 and 336 exposing both side portions of the semiconductor layer 322. The first and second contact holes 334 and 336 are positioned at both side portions of the gate electrode 330 to be spaced apart from the gate electrode 330.

In FIG. 6, the first and second contact holes 334 and 336 extend into the gate insulating layer 324. Alternatively, when the gate insulating layer 324 is patterned to have the same shape as the gate electrode 330, there may be no first and second contact holes 334 and 336 in the gate insulating layer 324.

A source electrode 340 and a drain electrode 342, which are formed of a conductive material, e.g., metal, are formed on the interlayer insulating layer 332. The source electrode 340 and the drain electrode 342 are spaced apart from each other with respect to the gate electrode 330 and respectively contact both side portions of the semiconductor layer 322 through the first and second contact holes 334 and 336.

The TFT Tr includes the semiconductor layer 322, the gate electrode 330, the source electrode 340 and the drain electrode 342 serving as a driving element.

The gate electrode 330, the source electrode 340 and the drain electrode 342 are positioned over the semiconductor layer 322. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may be formed of amorphous silicon.

Although not shown, a gate line and a data line, which cross each other to define a pixel region, are formed on or over the substrate 310, and a switching TFT, which is connected to the gate line, the data line and the TFT Tr, is formed. In addition, a power line, which is parallel to and spaced apart from the gate line or the data line, and a storage capacitor, which serves to maintain a voltage of the gate electrode of the TFT Tr for one frame, are formed.

Moreover, a color filter layer may be formed in a white QLED 300. For example, red, green and blue color filter patterns may be formed in each pixel region.

In a bottom emission type QLED 300, the color filter layer may be disposed between the interlayer insulating layer 332 and the quantum light emitting diode 400. In top emission type QLED 300, the color filter layer may be disposed on or over the quantum light emitting diode 400.

A planarization layer 350 is formed to cover the TFT Tr over the entire surface of the substrate 310. The planarization layer 350 provides a flat top surface and includes a drain contact hole 350 exposing the drain electrode 342 of the TFT Tr. The drain contact hole 352 may be spaced apart from the second contact hole 366 in a plane view.

The quantum light emitting diode 400 is positioned on the planarization layer 350 and is connected to the TFT Tr. The quantum light emitting diode 400 includes a first electrode 410, which is connected to the drain electrode 342 through the drain contact hole 352, a second electrode 420 facing the first electrode 410 and an emitting layer 430 between the first and second electrodes 410 and 420.

In the normal structure quantum light emitting diode 400, the first electrode 410 may serve as an anode, and the second electrode 420 may serve as a cathode. Alternatively, in the inversion structure quantum light emitting diode 400, the first electrode 410 may serve as a cathode, and the second electrode 420 may serve as an anode.

The first electrode 410 is separately formed in each pixel region. The first electrode 410 may include or be formed of a conductive material having a relatively high work function. For example, the first electrode 410 may include or be formed of indium-tin-oxide (ITO), indium-zinc-oxide (IZO), indium-tin-zinc-oxide (ITZO), indium-copper-oxide (ICO), tin oxide ($SnO_2$), indium oxide ($In_2O_3$), cadmium-zinc oxide alloy (Cd:ZnO), fluorine-tin oxide alloy F:$SnO_2$), indium-tin oxide alloy (In:$SnO_2$), gallium-tin oxide alloy (Ga:$SnO_2$) or aluminum-zinc oxide alloy (Al:ZnO). Alternatively, the first electrode 210 may include or be formed of nickel (Ni), platinum (Pt), gold (au), silver (Ag), iridium (Ir) or carbon nano-tube (CNT).

When the QLED 300 of the present disclosure is a top-emission type, a reflection electrode or a reflection layer may be formed under the first electrode 410. For example, the reflection electrode or the reflection layer may be formed of aluminum-palladium-copper (APC) alloy.

A bank layer 368, which covers edges of the first electrode 410, is formed on the planarization layer 350. The bank 368 exposes a center portion of the first electrode 410 in the pixel region.

The emitting layer 430 between the first and second electrodes 410 and 420 includes an EML 450 and a light-amount enhancing layer 470. The emitting layer 430 may further include a first charge transporting layer (not shown) between the first electrode 410 and the EML 450 and a second charge transporting layer (not shown) between the second electrode 420 and the EML 450. The light-amount enhancing layer 470 may be disposed between the first charge transporting layer and the EML 450.

The second electrode 420 is formed over the substrate 310 including the emitting layer 430. The second electrode 420 is positioned at the entire surface of the display area. The second electrode 420 may include or be formed of a conductive material having a relatively low work function. For example, the second electrode 420 may include or be formed of Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

The light-amount enhancing layer 470 is positioned between the first electrode 410 and the EML 450. The light-amount enhancing layer 470 includes a concave portion and a convex portion. For example, the light-amount enhancing layer 470 may include a plurality of prism patterns 472.

In FIG. 6, the prism patterns 472 have a triangular shape. Alternatively, in the bottom emission type QLED 300, the prism patterns 472 have the opposite direction to be an inverted triangular shape.

The quantum particle 452 is disposed in a space between adjacent prism patterns 472, i.e., a concave portion of the light-amount enhancing layer 470, such that the direction of the light from the quantum particle 452 toward the lateral side is changed toward the emitting side. Accordingly, the light loss is reduced, and the out-coupling efficiency and the brightness of the QLED 400 are increased.

Optical Efficiency According to the Shape of the Prism Pattern

The optical efficiency of the quantum light emitting diode is tested according to the width of the prism pattern and the pitch of the prism patterns. The prism pattern has an refractive index of 1.59, and the light source, i.e., the quantum particle, in the valley of the prism pattern has a volume of 0.1×0.1×100 $mm^3$. The light amount (luminous flux) at the emitting side is measured and listed in Table 1.

TABLE 1

| base angle [°] | width [mm] | Pitch [mm] | light amount [lm] |
| --- | --- | --- | --- |
| 45 | 0.4 | 0.5 | 50.956 |
| 45 | 0.4 | 0.7 | 47.02 |
| 45 | 0.4 | 0.9 | 45.769 |

As shown in Table 1, as the pitch is decreased, the light amount from the quantum particle toward the emitting side is increased.

The optical efficiency of the quantum light emitting diode is tested according to the base angle the prism patterns. The prism pattern has an refractive index of 1.59, and the light source, i.e., the quantum particle, in the valley of the prism pattern has a volume of 0.1×0.1×100 mm3. The light amount (luminous flux) at the emitting side is measured and listed in Table 2.

TABLE 2

| base angle [°] | height [mm] | base side [mm] | light amount [lm] |
|---|---|---|---|
| — | — | — | 48.573 |
| 68 | 0.1 | 0.08 | 48.154 |
| 63 | 0.1 | 0.1 | 48.461 |
| 45 | 0.1 | 0.2 | 53.804 |
| 34 | 0.1 | 0.3 | 52.912 |
| 27 | 0.1 | 0.4 | 51.875 |
| 24 | 0.1 | 0.45 | 53.54 |
| 22 | 0.1 | 0.5 | 54.7 |
| 20 | 0.1 | 0.55 | 54.334 |
| 18 | 0.1 | 0.6 | 53.434 |
| 16 | 0.1 | 0.7 | 53.7 |
| 14 | 0.1 | 0.8 | 53.098 |
| 12 | 0.1 | 0.9 | 53.073 |
| 11 | 0.1 | 1 | 53.236 |

As shown in Table 2, the quantum light emitting diode has an excellent light amount with the base angle of about 10 to 45 degree, particularly about 10 to 24 degree, more particularly about 20 to 24 degree.

Optical Property According to the Prism Pattern
(1) Example (Ex)

The EML including QDs (CdSe core and CdS shell) is formed on the light-amount enhancing layer. In the light-amount enhancing layer, the prism pattern has the base angle of 45 degree, and the ratio of the height (15 μm) to the base side (30 μm) is 1:2. The ratio of the base side to the pitch is 1:1. The EML is coated by spin coating apparatus with 1000 rpm for 30 seconds and dried under the temperature of 60° C. for 1 hour. The major axis of the QDs is arranged to be vertical or horizontal to the prism pattern. (rotation by 90 degree in a horizontal plane)

(2) Comparative Example (Ref)

The EML is formed without the light-amount enhancing layer.

The PL integration value and the polarization property (degree) of the quantum light emitting diode in "Example" and "Comparative Example (Ref)" are measured and listed in Table 3.

TABLE 3

| | PL integration | | |
|---|---|---|---|
| | vertical | horizontal | polarization degree |
| Ex | 106 | 223.9 | 35.7% |
| Ref | 40.9 | 75.8 | 29.9% |

In comparison to the polarization property (degree) of the quantum light emitting diode in "Comparative Example", the polarization property (degree) of the quantum light emitting diode in "Example" is improved. Namely, due to the light-amount enhancing layer, the arrangement degree of the QDs is improved. In addition, the PL integration value of the quantum light emitting diode in "Example" is improved.

Figure 7:
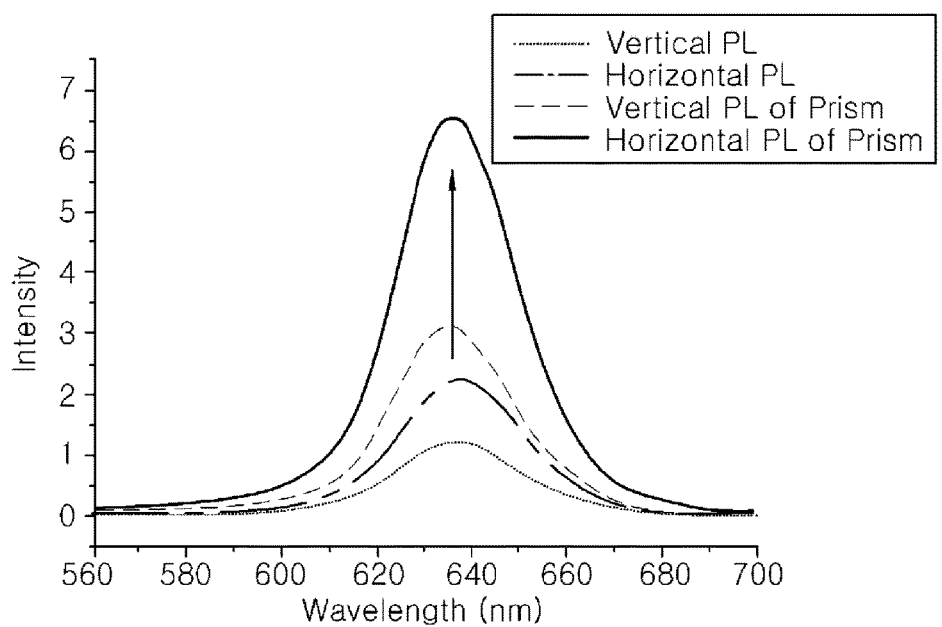
FIG. 7 is a graph of a photoluminescence (PL) intensity in the quantum light emitting diode.

The PL intensity of the quantum light emitting diode in "Example" and "Comparative Example (Ref)" is measured and shown in FIG. 7. As shown in FIG. 7, with the light-amount enhancing layer having the prism pattern, the PL intensity of the quantum light emitting diode ("Vertical PL of Prism" and "Horizontal PL of Prism") is increased. In addition, with the light-amount enhancing layer and horizontally arranged QDs, the quantum light emitting diode ("Horizontal PL of Prism") has the excellent PL peak. (about 3 times of "Horizontal PL" without the light-amount enhancing layer).

It will be apparent to those skilled in the art that various modifications and variations can be made in the aspects of the disclosure without departing from the spirit or scope of the disclosure. Thus, it is intended that the modifications and variations cover this disclosure provided they come within the scope of the appended claims and their equivalents.

What is claimed is:

1. A quantum light emitting diode, comprising:
   a first electrode;
   a second electrode facing the first electrode;
   a light-amount enhancing layer between the first and second electrodes and having a structure guiding emitted light toward an emitting side; and
   an emitting material layer between the light-amount enhancing layer and the second electrode; and including a quantum particle at the structure of the light-amount enhancing layer.

2. The quantum light emitting diode according to claim 1, wherein the structure of the light-amount enhancing layer includes at least one convex portion and one concave portion.

3. The quantum light emitting diode according to claim 2, wherein the at least one convex and one concave portions form a prism pattern.

4. The quantum light emitting diode according to claim 3, wherein the prism pattern has a base angle in a range of about 10 to 45 degree.

5. The quantum light emitting diode according to claim 3, wherein the prism pattern has a ratio of a base side to a pitch to be 1:1 to 2:3.

6. The quantum light emitting diode according to claim 3, wherein the prism pattern has a ratio of a height to a base side to be 1:2 to 1:10.

7. The quantum light emitting diode according to claim 1, further comprising:
   a first charge transporting layer between the first electrode and the light-amount enhancing layer; and
   a second charge transporting layer between the emitting material layer and the second electrode.

8. The quantum light emitting diode according to claim 7, wherein one of the first and second charge transporting layers include an organic material and the other one of the first and second charge transporting layers include an inorganic material.

9. The quantum light emitting diode according to claim 7, wherein one of the first and second charge transporting layers is a hole transporting layer, and the other one of the first and second charge transporting layers is an electron transporting layer.

10. The quantum light emitting diode according to claim 2, wherein the at least one convex portion protrudes from the first charge transporting layer toward the second electrode.

11. The quantum light emitting diode according to claim 1, wherein the quantum particle has a major axis parallel to a length direction of the convex portion.

12. The quantum light emitting diode according to claim 1, wherein the light-amount enhancing layer controls an amount of electrons from the first charge transporting layer into the emitting material layer.

13. The quantum light emitting diode according to claim 1, wherein the quantum particle includes one of quantum dot and a quantum rod.

14. A quantum light emitting device, comprising:
   a substrate;
   a quantum light emitting diode over the substrate and including a first electrode, a second electrode facing the first electrode, a light-amount enhancing layer between the first and second electrodes and having a structure guiding emitted light toward an emitting side and an emitting material layer between the light-amount enhancing layer and the second electrode and including a quantum particle at the structure of the light-amount enhancing layer; and a driving element between the substrate and the quantum light emitting diode and connected to the quantum light emitting diode.

15. The quantum light emitting device according to claims 14, further comprising:
a hole transporting layer on the anode; and
an electron transporting layer on the emitting material layer.

16. The quantum light emitting device according to claims 15, wherein one of the hole transporting layer and the electron transporting layer includes an organic material and the other one of the hole transporting layer and the electron transporting layer includes an inorganic material.

17. A quantum light emitting diode, comprising:
an anode;
a cathode facing the anode;
a light-amount enhancing layer between the anode and the cathode and having a structure guiding emitted light toward an emitting side;
an emitting material layer between the light-amount enhancing layer and the anode; and
a quantum particle generating the emitted light and disposed at the light-amount enhancing layer.

18. The quantum light emitting diode according to claims 17, further comprising;
a hole transporting layer on the emitting material layer; and
an electron transporting layer on the cathode.

19. The quantum light emitting diode according to claims 17, wherein one of the hole transporting layer and the electron transporting layer includes an organic material and the other one of the hole transporting layer and the electron transporting layer includes an inorganic material.

* * * * *